(12) United States Patent  (10) Patent No.: US 7,588,959 B2
Miyazaki et al.  (45) Date of Patent: Sep. 15, 2009

(54) ORGANIC FIELD EFFECT TRANSISTOR AND METHOD FOR PRODUCING THE SAME

(75) Inventors: Hajime Miyazaki, Yokohama (JP); Daisuke Miura, Numazu (JP); Tomonari Nakayama, Yokohama (JP); Hidemitsu Uno, Matsuyama (JP); Noboru Ono, Matsuyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 741 days.

(21) Appl. No.: 10/542,807

(22) PCT Filed: Feb. 27, 2004

(86) PCT No.: PCT/JP2004/002449

§ 371 (c)(1),
(2), (4) Date: Jul. 20, 2005

(87) PCT Pub. No.: WO2004/079834

PCT Pub. Date: Sep. 16, 2004

(65) Prior Publication Data

US 2006/0081880 A1    Apr. 20, 2006

(30) Foreign Application Priority Data

Mar. 3, 2003    (JP) .............................. 2003-056144

(51) Int. Cl.
*H01L 51/40*    (2006.01)
(52) U.S. Cl. ........... 438/99; 257/E51.001; 257/E51.049
(58) Field of Classification Search .................. 438/99; 257/40, E51.049, E51.001
See application file for complete search history.

(56) References Cited

U.S. PATENT DOCUMENTS 5,840,600 A    11/1998    Yamazaki et al. ........... 438/151

(Continued)

FOREIGN PATENT DOCUMENTS

GB    1 206 129    9/1970

OTHER PUBLICATIONS

Ali Afzali, et al., "High-Performance, Solution-Processed Organic Thin Film Transistors from a Novel Pentacene Precursor", Journal of American Chemical Society, vol. 124, No. 30, 2002, pp. 8812-8813.

(Continued)

*Primary Examiner*—Caridad M Everhart
(74) *Attorney, Agent, or Firm*—Fitzpatrick, Cella, Harper & Scinto

(57) ABSTRACT

There is provided a method for producing a field effect transistor with a high field-effect mobility using a simple method for forming an organic semiconductor layer. A method for producing an organic field effect transistor comprising an organic semiconductor layer, comprising a step of forming the organic semiconductor layer by the photodecomposition of a bicyclic compound containing in a molecule thereof at least one bicyclic ring represented by formula (1):

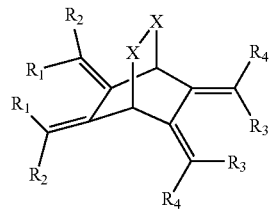

(1)

wherein $R_1$ and $R_3$ each denotes a group for forming an aromatic ring or a heteroaromatic ring which may have a substituent, together with a group to be bonded to $R_1$ or $R_3$; $R_2$ and $R_4$ each denotes a hydrogen atom, an alkyl group, an alkoxy group, an ester group or a phenyl group; and X is a leaving group which denotes carbonyl group or —N=.

18 Claims, 3 Drawing Sheets

U.S. PATENT DOCUMENTS

| | | |
|---|---|---|
| 7,094,625 B2 | 8/2006 | Miura et al. ................. 438/99 |
| 2004/0110093 A1* | 6/2004 | Afzali-Ardakani et al. .. 430/311 |
| 2004/0118520 A1 | 6/2004 | Nakayama et al. ..... 156/345.41 |
| 2004/0119073 A1* | 6/2004 | Ardakami et al. ............ 257/72 |
| 2005/0202348 A1 | 9/2005 | Nakayama et al. .......... 430/311 |
| 2005/0287697 A1 | 12/2005 | Unno et al. ................... 438/99 |
| 2006/0113523 A1 | 6/2006 | Kubota et al. ................. 257/40 |
| 2006/0142627 A1 | 6/2006 | Uno et al. |
| 2006/0145141 A1 | 7/2006 | Miura et al. ................. 257/40 |
| 2006/0214159 A1 | 9/2006 | Nakayama et al. ............ 257/40 |

OTHER PUBLICATIONS

Peter T. Herwig, et al., "A Soluble Pentacene Precursor: Synthesis, Solid-State Conversion into Pentacene and Application in a Field-Effect Transistor", Advanced Materials, vol. 11, No. 6, 1999, pp. 480-483.

Yutaka Ohmori, et al., "Fabrication and Characteristics of Schottky Gated Poly(3-alkylthiophene) Field Effect Transistors", Japanese Journal of Applied Physics, vol. 30, No. 4A, Apr. 1991, pp. L610-L611.

* cited by examiner

ORGANIC FIELD EFFECT TRANSISTOR AND METHOD FOR PRODUCING THE SAME

TECHNICAL FIELD

The present invention relates to an organic field effect transistor and a method for producing the same, and specifically to a field effect transistor with a high mobility using a fused aromatic ring compound obtained by irradiating a fused aromatic ring compound precursor that is soluble in a solvent with light as an organic semiconductor layer. Further, the present invention relates to a method for producing a field effect transistor in which a field effect transistor with a high mobility can be easily produced by using a film of a fused aromatic ring compound obtained by irradiating a coating film of a fused aromatic ring compound precursor that is soluble in a solvent with light as an organic semiconductor layer.

BACKGROUND ART

Non-linear optical properties, electrical conductivity and semiconductivity of organic semiconductor compounds have received attention in the organic electronics and optoelectronics fields and the development of various devices has been advanced actively. Typical examples of organic semiconductor compounds include phthalocyanine compounds, porphyrin compounds and polyacenes. Properties such as non-linear optical properties, electrical conductivity and semiconductivity, which are required for using these compounds as organic materials to form devices, largely depend on crystallinity and orientation other than only purity of each of the materials.

However, it was difficult to highly purify these materials due to the reason that many compounds with extended π-conjugated systems are insoluble in solvents and susceptible to oxidation in air. In addition, a large-scale apparatus has been required for forming films, for example, vacuum deposition has been performed to obtain crystallized films with high orientation. In recent years, organic field effect transistor (FET) devices using organic semiconductor compounds as the semiconductor layers have received attention. Organic semiconductor compounds, which show more flexible film properties than in organic materials such as silicon, have been regarded as suitable materials for producing flexible devices using plastics as substrates.

However, as described above, phthalocyanine compounds, porphyrin compounds, pentacene and the like that are typical examples of organic semiconductor compounds are hardly soluble in solvents, so the formation of their films on substrates has only been possible by vacuum deposition. Therefore, they have disadvantages in that complicated vacuum deposition apparatuses are necessary; substrate materials are limited because the substrate temperature must be maintained at high temperatures; and the like. On the other hand, FETs are fabricated more easily by forming thin films by spin coating or the like from a solution of organic semiconductors soluble in organic solvents. As an example of the above, π-conjugated polymers are used for semiconductor layers (Japan Society of Applied Physics, "Japanese Journal of Applied Physics," Vol. 30, pp. L610-L611, 1991). However, an organic FET of this type generally has a low mobility and improvement of the properties is expected.

In order to improve the above disadvantages, there is also reported a FET using a film in which a soluble precursor thin film of pentacene is formed by coating and transformed to pentacene by heat-treatment (WILLEY-VCH Verlag GmbH, "Advanced Materials," Vol. 11, p. 480-483, 1999).

In this case, the conversion to pentacene by a reverse Diels-Alder reaction has required a high-temperature treatment of 170° C. or more. Further, conversion to pentacene at a low temperature is also reported (American Chemical Society, "Journal of American Chemical Society," Vol. 124, p. 8812-8813, 2002), but there was a problem in the stability of a soluble precursor of pentacene.

DISCLOSURE OF THE INVENTION

As described above, FET devices using organic semiconductors have required a complicated process such as vacuum deposition or tight control of production conditions (such as temperature and material storage environment). In addition, a low solubility of organic semiconductor material itself has made it difficult to purify the material and to improve the field-effect mobility of the FET device.

The present invention has been created to solve these problems, and it is an object of the present invention to provide a field effect transistor using an organic semiconductor material with a high field-effect mobility.

It is a further object of the present invention to provide a method for producing a field effect transistor with a high field-effect mobility using a simple method for forming an organic semiconductor layer.

The present inventors have found that an organic semiconductor material and organic semiconductor layer can be obtained simply with high purity by using the photodecomposition of an organic semiconductor precursor as the means for forming the organic semiconductor material or organic semiconductor layer. Specifically, the present inventors have found that the field effect transistor, in which the organic semiconductor material produced by the photodecomposition of the organic semiconductor precursor is used as the organic semiconductor layer, shows the field-effect mobility that is equal to or higher than organic semiconductor layers composed of compounds produced by conventional methods.

Furthermore, it has been found that the organic field effect transistor using the organic semiconductor layer produced by the light irradiation to the organic semiconductor precursor film shows the field-effect mobility that is equal to or higher than organic semiconductor layers produced by conventional methods such as deposition or thermal decomposition.

It has been found that the use of the method for producing the organic semiconductor layer by the light irradiation to the organic semiconductor precursor film allows light pattering in the process for producing the organic field effect transistor, and the light patterning allows very simple production of the organic field effect transistor compared with conventional deposition or thermal decomposition reaction. The present invention has been created based on these findings.

Namely, the present invention is an organic field effect transistor comprising an organic semiconductor layer, wherein the organic semiconductor layer is composed of an organic semiconductor material produced by the photodecomposition of an organic semiconductor precursor.

Further, the present invention is a method for producing an organic field effect transistor comprising an organic semiconductor layer, which comprises a step of forming the organic semiconductor layer by the photodecomposition of an organic semiconductor precursor.

The organic semiconductor precursor is preferably a bicyclic compound containing in a molecule at least one bicyclic ring represented by formula (1):

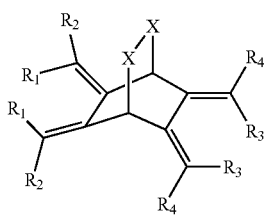

(1)

(wherein R₁ and R₃ each denotes a group for forming an aromatic ring or a heteroaromatic ring which may have a substituent, together with a group to be bonded to R₁ or R₃; R₂ and R₄ each denotes a hydrogen atom, an alkyl group, an alkoxy group, an ester group or a phenyl group; and X is a leaving group, which denotes a carbonyl group or —N=.)

The organic semiconductor precursor is preferably composed of a bicyclic compound represented by formula (1a):

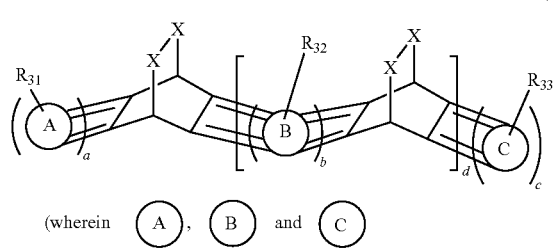

(1a)

denote an aromatic ring or a heteroaromatic ring which may have a substituent; a, b and c each denotes an integer of 1 to 4; d denotes an integer of 0 to 4; R₃₁, R₃₂ and R₃₃ each denotes at least one hydrogen atom, alkyl group, alkoxy group, ester group, aryl group, aralkyl group, phenoxy group, cyano group, nitro group or halogen atom, which may be the same or different; and X is a leaving group, which denotes a carbonyl group or —N=.)

The organic semiconductor precursor is preferably 6,13-ethanopentacene-6,13-dione represented by formula (2):

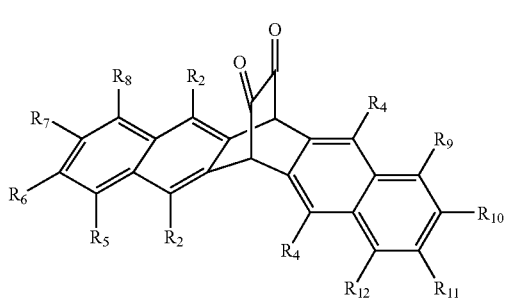

(2)

(wherein R₂ and R₄ each denotes a hydrogen atom, an alkyl group, an alkoxy group, an ester group or a phenyl group; and R₅ to R₁₂ each denotes a hydrogen atom, an alkyl group, an alkoxy group, an aryl group, an aralkyl group, a phenoxy group, a cyano group, a nitro group, an ester group or a halogen atom, which may be the same or different.)

The above described organic semiconductor precursor is preferably formed in a pattern.

In the production method of the present invention, the above-described photodecomposition is preferably performed by irradiating a film composed of an organic semiconductor precursor with light through an exposure mask.

In the production method of the present invention, the above-described photodecomposition is preferably performed by direct drawing with light on a film composed of an organic semiconductor precursor.

In the production method of the present invention, portions that are not irradiated with light of the film composed of the above-described organic semiconductor precursor is preferably rinsed with a solvent.

According to the present invention, an organic field effect transistor with a high field-effect mobility can be produced by a method far simpler than conventional methods.

BRIEF DESCRIPTION OF THE DRAWINGS

FIGS. 2A and 2B are schematic views of the substrate of the organic field effect transistor in Example 4 of the present invention, wherein FIG. 2A is a plan view and FIG. 2B is a sectional view taken in the line 2B-2B of FIG. 2A;

BEST MODE FOR CARRYING OUT THE INVENTION

Figure 1:
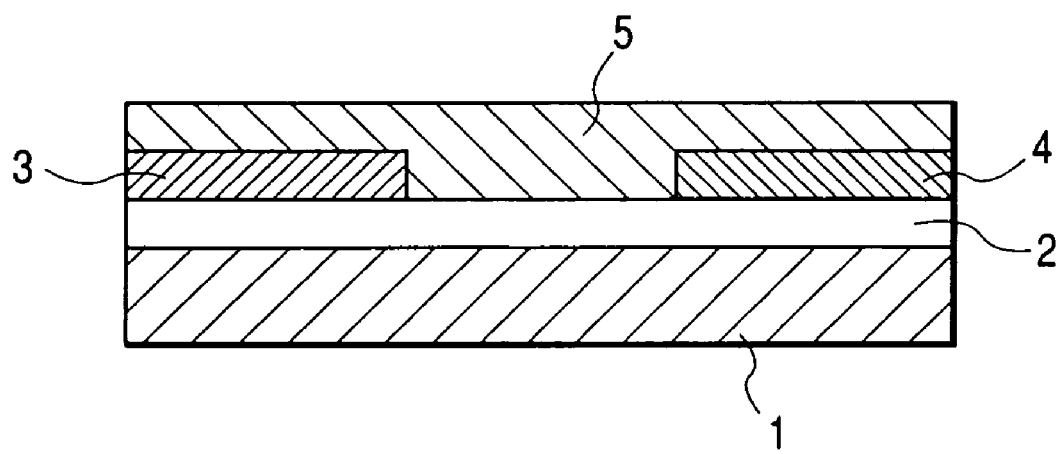
FIG. 1 shows the configuration of Examples 1, 2 and 3 and is an enlarged cross sectional view schematically showing a part of an organic field effect transistor composed of a gate electrode, a gate insulating layer, a source electrode, a drain electrode and an organic semiconductor layer.

Hereinafter, the present invention will be described in detail.

The present invention provides a field effect transistor that can be produced by a simple method and shows a high field-effect mobility using a fused aromatic ring compound obtained by irradiating a bicyclic compound that is soluble in solvent with light as an organic semiconductor layer.

The present invention is an organic field effect transistor using a fused aromatic ring compound that is produced by irradiating a bicyclic compound containing in a molecule thereof at least one bicyclic ring represented by formula (1) with light as an organic semiconductor layer. Further, the present invention is a method for producing a field effect transistor, comprising producing an organic semiconductor by the light irradiation to a film of a bicyclic compound represented by formula (1) to directly form an organic semiconductor layer.

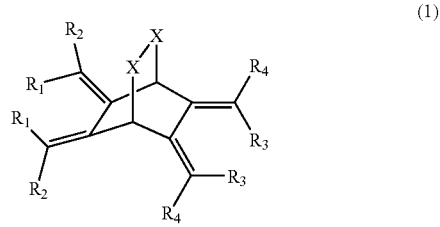

(1)

In formula (1), $R_1$ and $R_3$ denote a group for forming an aromatic ring or a heteroaromatic ring which may have a substituent, together with a group to be bonded to $R_1$ or $R_3$. The aromatic ring or heteroaromatic ring includes benzene ring, a naphthalene ring, an anthracene ring, a pyridine ring, a pyrrole ring or a thiophene ring; and the substituent includes an alkyl group such as methyl, ethyl or propyl, an aryl group such as phenyl or naphthyl, an aralkyl group such as benzyl or phenethyl, an alkoxy group such as methoxy or ethoxy, a phenoxy group, a carboxyl group, a carbo ester group, a cyano group, a nitro group or a halogen atom such as fluorine, chlorine, bromine or iodine. $R_2$ and $R_4$ each denotes a hydrogen atom, an alkyl group such as methyl, ethyl or propyl, an alkoxy group such as methoxy or ethoxy, an ester group or a phenyl group.

In the bicyclic compound represented by formula (1), X denotes a leaving group, which includes carbonyl and —N=. X—X denotes —CO—CO— or —N=N—, and elimination of two carbon monoxide molecules or nitrogen gas allows a residual part to form an aromatic ring. Thus the bicyclic compound is converted to a fused aromatic ring compound.

Here, the wavelength of the light with which the compound of formula (1) is irradiated may be within the absorption wavelength region that the compound of formula (1) has, and preferably which selected from the wavelengths in the longer wavelength side of the absorption wavelength region. A light source to be selected includes a tungsten lamp, a halogen lamp, a metal halide lamp, a sodium lamp, a xenon lamp, a high-pressure mercury-vapor lamp, a low-pressure mercury-vapor lamp, various laser lights or the like. Further, the light source to be used is preferably a light source having a light emission intensity of 300 W or more. Too weak intensity may cause side reaction.

This reaction can be performed in a state where the compound represented by formula (1) is dissolved or suspended in a solvent or in a state of a film such as a coating film or deposited film.

The solvent for the reaction in which light irradiation is performed includes methanol, ethanol, butanol, acetone, methyl ethyl ketone, methyl isobutyl ketone, cyclohexanone, hexane, heptane, cyclohexane, tetrahydrofuran, dioxane, diethyl ether, isopropyl ether, dibutyl ether, toluene, xylene, 1,2-dimethoxy ethane, chloroform, methylene chloride, dimethyl sulfoxide, N-methylpyrrolidone, chlorobenzene, dichlorobenzene, trichlorobenzene or the like.

The reaction temperature of the light irradiation reaction may be selected in a wide range by considering the stability, solubility and the like of the solvent capable of dissolving the compound of formula (1), and is preferably the range from the boiling point to the freezing point of the solvent to be actually used. Further, the solvent is preferably purged with an inert gas. When the photodecomposition reaction is performed in a solvent, a high-purity fused aromatic ring compound can be obtained in good yield.

Further, a method for producing an organic semiconductor layer includes a method comprising dissolving a bicyclic compound represented by formula (1) in a solvent, coating the solution on a substrate and then irradiating the coating with light to directly obtain a film of a corresponding fused aromatic ring compound on the substrate. The organic solvent used for dissolving the bicyclic compound is not particularly limited provided that the bicyclic compound does not react or precipitate. In addition, two or more organic solvents can be used in combination. It is necessary to select solvents in consideration of the smoothness of the surface of a coating film and the uniformity of film thickness.

The solvent includes methanol, ethanol, butanol, acetone, methyl ethyl ketone, methyl isobutyl ketone, cyclohexanone, hexane, heptane, cyclohexane, tetrahydrofuran, dioxane, diethyl ether, isopropyl ether, dibutyl ether, toluene, xylene, 1,2-dimethoxy ethane, chloroform, methylene chloride, dichloroethane, 1,2-dichloroethylene, dimethyl sulfoxide, N-methylpyrrolidone, chlorobenzene, dichlorobenzene, trichlorobenzene or the like. The solution is adjusted to any concentration depending on desired film thicknesses, preferably from 0.01 to 5% by weight.

A coating method includes spin casting, dipping, dropping, printing such as offset or screen printing or ink jet.

Further, it is desirable to preliminarily filter the solution through a filter in order to prevent the intrusion of dirt into a semiconductor layer as much as possible. Because insolubles and the intrusion of dirt from outside prevent uniform orientation and cause the increase of the off current and the reduction of the on/off ratio. The coating film of a bicyclic compound may be preliminarily dried.

The film of a bicyclic compound that is formed by coating is irradiated with light to cause elimination of an X-group to be converted to a fused aromatic ring compound. The above described light sources can be utilized for the light irradiation. Uniformity of the light irradiation needs to be considered for irradiating a large area, and attachment between a mask and the film, a leak of light at a mask edge part and the like need to be taken care of for the light irradiation through the mask. Further, the exposure method in which the greatest advantage of the present invention is shown includes a direct exposure with focused light or laser light. This method eliminates a mask for forming an organic semiconductor layer, allowing a substantial reduction of cost in the production of transistors.

After the light irradiation, the irradiated part precipitates as a fused aromatic ring compound and the non-irradiated part remains as a bicyclic compound. Thus, when the latter part is unnecessary, it is possible to remove it by washing with a solvent. Those solvents which dissolve bicyclic compounds as described above will be selected.

At the same time as the production of a fused aromatic ring compound by the light irradiation, a crystallized film of the fused aromatic ring compound will be obtained, induced by the crystal growth due to the stacking of aromatic rings. Although the elimination reaction occurs in room temperature, the substrate may be heated to help the crystal growth due to the stacking of aromatic rings. In addition, the crystal growth is also helped by rubbing treatment in which the coating film before light irradiation is lightly rubbed with a cloth or the like. The cloth used for the rubbing treatment includes, but not limited to, rayon, cotton or silk.

The film thickness of the organic semiconductor layer using the fused aromatic ring compound obtained by these operations is preferably in the range from 30 to 600 nm. When the film thickness is not larger than 30 nm, the uniformity of the film thickness will be impaired. On the other hand, when it is not smaller than 600 nm, the mobility will be reduced due to the impairment of the smoothness of a film surface.

A further preferable example of the present invention includes a 6,13-ethanopentacene-6,13-dione compound represented by formula (2):

(2)

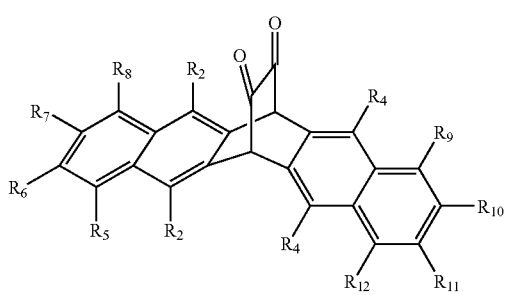

wherein $R_2$ and $R_4$ each denotes a hydrogen atom, an alkyl group such as methyl, ethyl or propyl, an alkoxy group such as methoxy or ethoxy, an ester group or a phenyl group. $R_5$ to $R_{12}$ each denotes a hydrogen atom, an alkyl group such as methyl, ethyl or propyl, an alkoxy group such as methoxy or ethoxy, an aryl group such as phenyl or naphthyl, an aralkyl group such as benzyl or phenethyl, a phenoxy group, a cyano group, a nitro group, a carbo ester group or a halogen atom such as fluorine, chlorine, bromine or iodine, which may be the same or different.

When the compound represented by formula (2) is irradiated with light, it will decompose as indicated by reaction scheme (3) and a pentacene compound with high purity can be obtained.

(3)

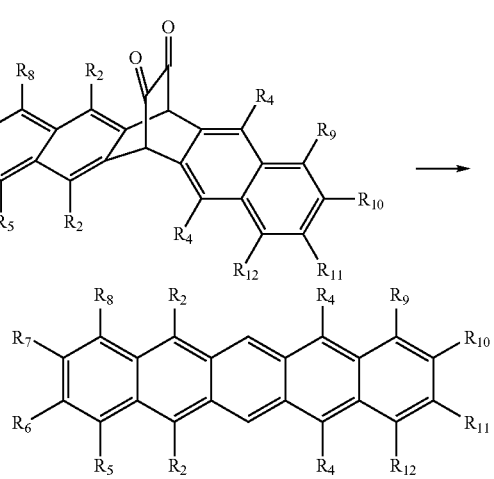

Further, a film of a pentacene compound can be obtained by irradiating a film formed of a compound represented by formula (2) with light. Detail conditions thereof are the same as in the case of the bicyclic compound represented by formula (1) described above.

Next, a typical synthetic route of the bicyclic compound to be used in the present invention is shown below using the synthesis of 6,13-ethanopentacene-6,13-dione, which is a compound example (6), as an example.

The synthetic route is composed of the steps as represented by reaction scheme (4):

(4)

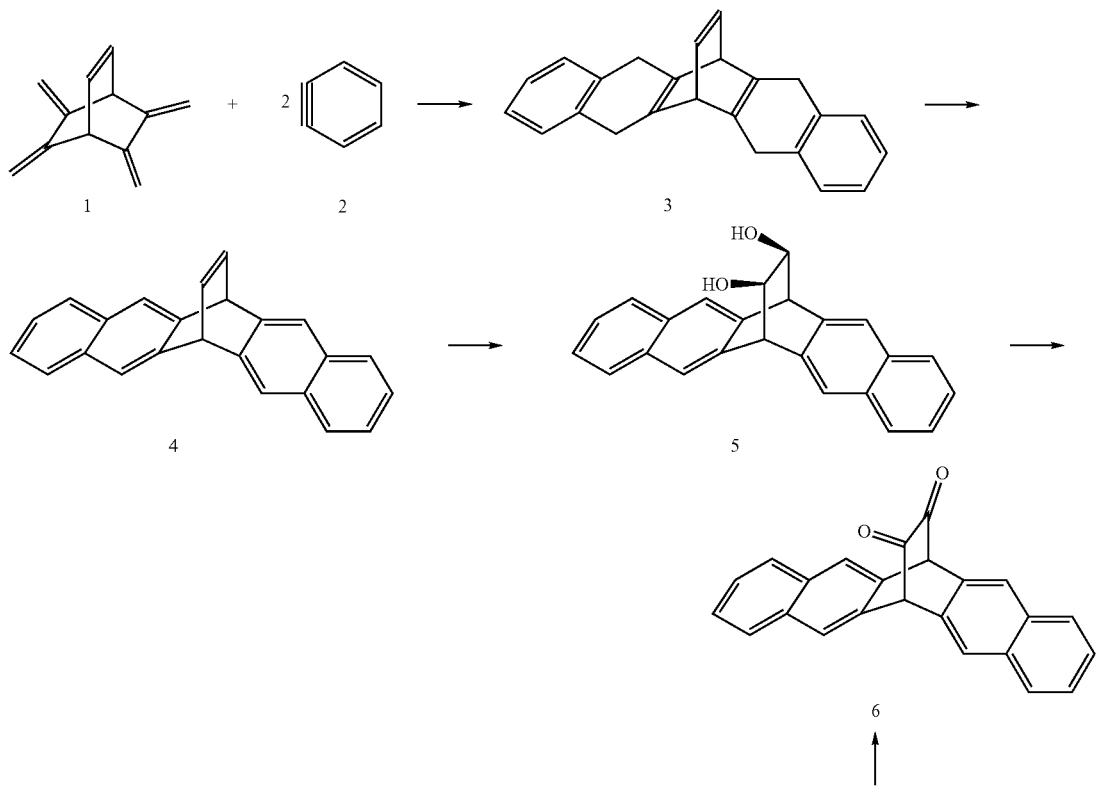

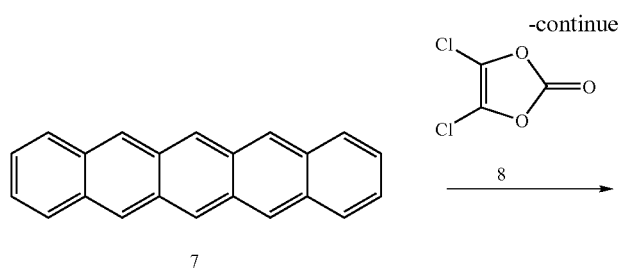
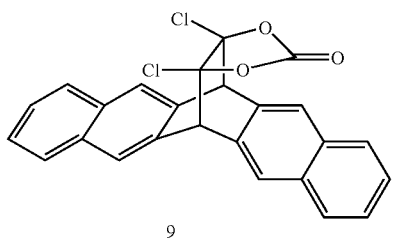

Namely, a tetraene compound (1) reacts with two molecules of benzyne (2) by addition to produce an adduct (3); the adduct (3) is subjected to dehydrogenation reaction to produce an ethylene adduct (4); the compound (4) is oxidized to a diol (5) by an oxidizing agent such as osmium tetroxide; and the diol (5) is oxidized to a ketone body, to thereby be capable of providing 6,13-ethanopentacene-6,13-dione (6). The compound (6) is easily decomposed by light irradiation to be converted to pentacene (7). The compound (6) can also be synthesized by direct addition of ethylene to pentacene.

Further, another step shown in the lowest step of reaction scheme is also possible. Specifically, the compound (6) can be obtained by treating a compound (9), which is prepared by adding dichloroethylene carbonate (8) to pentacene (7), with alkali such as KOH or the like.

An asymmetric bicyclic compound can be obtained according to a route represented by reaction scheme (5), in which the tetraene compound (1) is added with an equivalent amount of benzyne to obtain a diene (10), which is further added with benzyne (11) having a different substituent, and subsequently treated in the same manner as in reaction scheme (4) to obtain the asymmetric bicyclic compound (15).

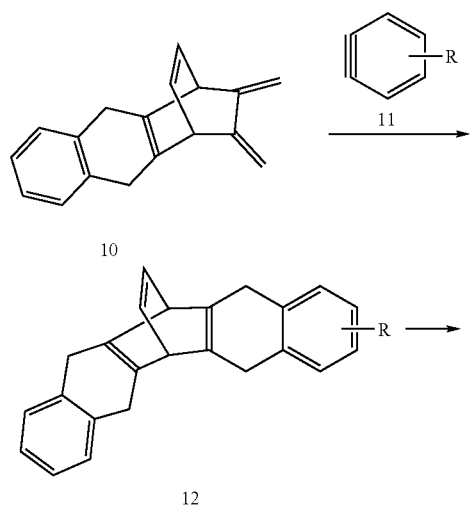

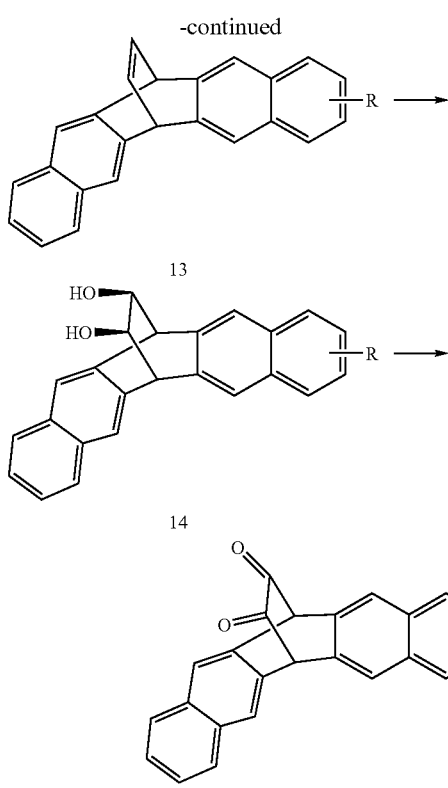

Further, a compound (20) which has two bicyclic rings in a molecule can be synthesized through a route in which dibenzyne (16) is used, as shown in reaction scheme (6). As an application of this reaction, equivalent amount of dibenzyne (16) is reacted with the compound (10) to obtain a product, which is added with the compound (1) to obtain a product, which is added with an equivalent amount of dibenzyne (16), which is subsequently reacted with the compound (10) and converted to a ketone body through alcohol in the same manner as in reaction scheme (4) to thereby be capable of synthesizing a compound (21) which has three bicyclic rings. Equivalent amount of dibenzyne (16) is reacted with the compound (10) to obtain a product, which is reacted with the compound (1) to obtain a product, which is reacted with one-half equivalent amount of dibenzyne (16) and converted to a ketone body through alcohol in the same manner as in reaction scheme (4), to thereby be capable of obtaining a compound which has four bicyclic rings.

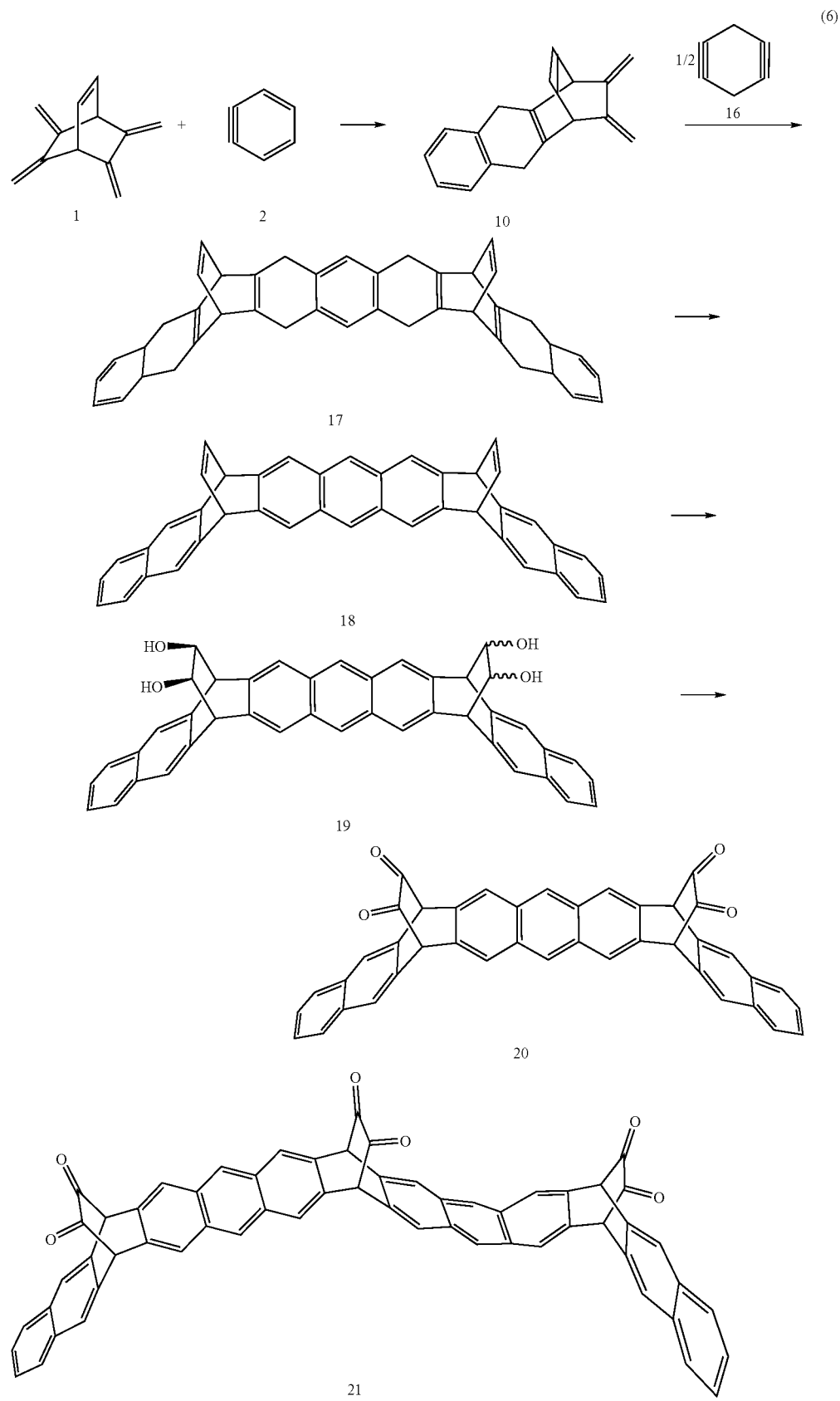

These reaction routes are only a part of examples, and the route to obtain a compound of formula (1) is not limited to them.

The bicyclic compound of the present invention preferably includes a compound represented by formula (1a):

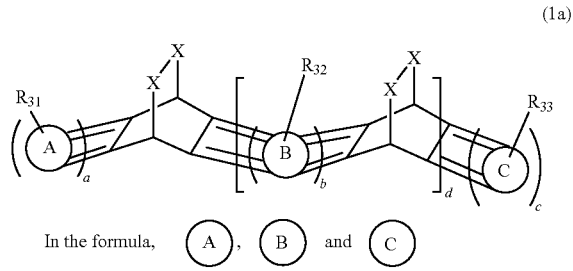

(1a)

In the formula, (A), (B) and (C) denote an aromatic ring or a heteroaromatic ring which may have a substituent.

In the formula, a, b and c each denotes an integer of 1 to 4, and d denotes an integer of 0 to 4.

When the aromatic ring or heteroaromatic ring has no substituent, $R_{31}$, $R_{32}$ and $R_{33}$ each denotes a hydrogen atom. When the aromatic ring or heteroaromatic ring has any substituent, $R_{31}$, $R_{32}$ and $R_{33}$ each denotes an alkyl group, an alkoxy group, an ester group, an aryl group, an aralkyl group, a phenoxy group, a cyano group, a nitro group or a halogen atom, which may be one or more and may be the same or different.

X is a leaving group, which denotes a carbonyl group or —N═. However, X—X forms —CO—CO— or —N═N— group.

Examples of bicyclic compounds used in the present invention are shown below. However, they have one bicyclic ring and a carbonyl group as X.

TABLE 2-continued

| Compound No. | Group formed by (R1, R2) | Group formed by (R3, R4) |
|---|---|---|
| 30 | 6-F naphthalene-2,3-diyl | 6-F naphthalene-2,3-diyl |
| 31 | 6-CN naphthalene-2,3-diyl | 6-CN naphthalene-2,3-diyl |
| 32 | 6-CH3 naphthalene-2,3-diyl | 6-CH3 naphthalene-2,3-diyl |
| 33 | 6,7-(CH3)2 naphthalene-2,3-diyl | 6,7-(CH3)2 naphthalene-2,3-diyl |
| 34 | 5,6,7,8-F4 naphthalene-2,3-diyl | 5,6,7,8-F4 naphthalene-2,3-diyl |
| 35 | 6-Ph naphthalene-2,3-diyl | 6-Ph naphthalene-2,3-diyl |
| 36 | 6-CH2Ph naphthalene-2,3-diyl | 6-CH2Ph naphthalene-2,3-diyl |

TABLE 3

| Compound No. | Group formed by (R1, R2) | Group formed by (R3, R4) |
|---|---|---|
| 37 | 6-CO2CH3 naphthalene-2,3-diyl | 6-CO2CH3 naphthalene-2,3-diyl |

TABLE 3-continued

| Compound No. | Group formed by [R1, R2 structure] | Group formed by [R3, R4 structure] |
| --- | --- | --- |
| 38 | H3CO-naphthalene | naphthalene-OCH3 |
| 39 | tetrafluoronaphthalene | naphthalene |
| 40 | dicyano-naphthalene (NC, NC) | naphthalene |
| 41 | dimethyl-naphthalene (H3C, H3C) | naphthalene |
| 42 | dimethoxy-naphthalene (H3CO, H3CO) | dicyano-naphthalene (CN, CN) |
| 43 | naphthalene | anthracene |
| 44 | anthracene | difluoro-naphthalene (F, F) |

TABLE 4

| Compound No. | Group formed by [R1, R2 structure] | Group formed by [R3, R4 structure] |
| --- | --- | --- |
| 45 | dicyano-anthracene (NC, NC) | dicyano-naphthalene (CN, CN) |

TABLE 4-continued

| Compound No. | Group formed by $\begin{smallmatrix}R_2\\R_1\\R_1\\R_2\end{smallmatrix}$ | Group formed by $\begin{smallmatrix}R_4\\R_3\\R_3\\R_4\end{smallmatrix}$ |
| --- | --- | --- |
| 46 | hexafluoro anthracene-diyl | tetrafluoro naphthalene-diyl |
| 47 | anthracene-diyl | dimethyl naphthalene-diyl |
| 48 | anthracene-diyl | anthracene-diyl |
| 49 | hexafluoro anthracene-diyl | hexafluoro anthracene-diyl |
| 50 | cyano-anthracene-diyl | cyano-anthracene-diyl |
| 51 | dichloro-tetracene-diyl | dichloro-tetracene-diyl |

TABLE 5

| Compound No. | Group formed by $\begin{smallmatrix}R_2\\R_1\\R_1\\R_2\end{smallmatrix}$ | Group formed by $\begin{smallmatrix}R_4\\R_3\\R_3\\R_4\end{smallmatrix}$ |
| --- | --- | --- |
| 52 | dimethoxy tetracene-diyl | dimethoxy tetracene-diyl |

TABLE 5-continued

| Compound No. | Group formed by $R_1, R_2$ | Group formed by $R_3, R_4$ |
|---|---|---|
| 53 | (anthracene-like group with methyl) | (anthracene-like group with two CH$_3$ and methyl) |
| 54 | (anthracene-like group with methyl) | (tetracene-like group with methyl) |
| 55 | (tetracene-like group with methyl) | (pentacene-like group with methyl) |

Examples of the compounds having two or three bicyclic rings include the above compounds (20) and (21).

Further, the same substituents as $R_2$, $R_4$ and $R_5$ to $R_{12}$ represented in formula (2) can be selected to the compounds (20) and (21).

Materials for a gate electrode, source electrode and drain electrode constructing the organic field effect transistor of the present invention are not particularly limited, provided that they are electrically conductive materials, and include platinum, gold, silver, nickel, chromium, copper, iron, tin, antimony, lead, tantalum, indium, aluminum, zinc, magnesium and alloys thereof; conductive metal oxides such as indium-tin oxide; and inorganic and organic semiconductors whose conductivity is increased by doping or the like, for example, silicon single-crystal, polysilicon, amorphous silicon, germanium, graphite, oxyacetylene, polyparaphenylene, polythiophene, polypyrrole, polyaniline, polythienylenevinylene and polyparaphenylenevinylene.

A method for producing the electrode includes a sputtering method, deposition method, printing method from a solution or paste or ink jet method. Further, preferable electrode materials among the above materials are those having a low electrical resistance at the contact surface with a semiconductor layer.

Any insulating film may be utilized provided that a solution of the compound represented by formula (1) can be uniformly coated on it, but those having a high dielectric constant and low conductivity are preferred. Examples include inorganic oxides and nitrides such as silicon oxide, silicon nitride, aluminum oxide, titanium oxide and tantalum oxide; and organic polymers such as polyacrylates, polymethacrylates, polyethylene terephthalate, polyimides, polyethers and siloxane-containing polymers. In addition, among the above insulating materials, those having a high surface-smoothness are preferred.

In order to improve the uniformity of the coating film of a solution of the compound represented by formula (1) on the insulating film or to make the orientation of the film of a fused aromatic ring compound produced by light irradiation uniform, only the surface of the insulating film may be modified. The method includes a dry treatment using ozone, plasma and a hexamethyldisilane gas and a wet treatment using a solution prepared by dissolving tetraalkoxysilane, trichlorosilane, a surfactant and the like in an organic solvent.

The structure of the field effect transistor in the present invention is not limited to a thin film type but may be a three-dimensional.

EXAMPLES

Hereinafter, the present invention will be described in detail by examples.

First, synthesis examples of the bicyclic compounds to be used in the present invention will be described taking the compound (6) as an example.

Synthesis Example 1

Synthesis of Compound (3)

5,6,7,8-tetramethylidenebicyclo[2,2,2]oct-2-ene (1) (12 mmol, 1.91 g) and isoamyl nitrite (75 mmol, 10.0 ml) were dissolved in 80 ml of THF (tetrahydrofuran) in a reaction vessel and refluxed by heating. A solution in which anthranilic acid (91 mmol, 12.5 g) was dissolved in 100 ml of THF was charged into a dropping funnel, and it was slowly dropped. After the dropping, heating and stirring were continued until all raw materials are consumed. After the completion of reaction, an aqueous sodium hydroxide solution was added; stirring was continued; and the reaction solution was extracted with hexane. The resultant organic layer was washed with water and saturated saline, dried over anhydrous sodium sulfate and then concentrated to obtain a crude product. This was purified by silica gel column chromatography (hexane) to obtain the compound (3). The yield was 2.66 g (72%).

Molecular formula: $C_{24}H_{20}$ (308.42)

Shape: White crystal $^1$H NMR (CDCl$_3$) δ=7.10 (4H, s), 6.85 (4H, to J=3.41), 4.29 (2H, t, J=3.41), 3.60 (8H, s) [270 MHz]

$^{13}$C NMR (CDCl$_3$) δ=140.179, 139.254, 134.241, 128.715, 125.858, 54.197, 33.164 [67.8 MHz]

Mass spectrum (FAB) m/z: 308 (M+: 22)

Elemental analysis: Calcd (%) C=93.46; H=6.54; Found (%) C=93.54; H=6.68.

Synthesis of Compound (4)

The compound (3) (4.02 mmol, 1.24 g) was charged into a reaction vessel and dissolved in 50 ml of chloroform. This solution was added with DDQ (2,3-dichloro-5,6-dicyano-1,4-benzoquinone) (8.04 mmol, 1.80 g) and stirred for 2 hours. The resultant solution was added and well mixed with a saturated aqueous sodium bicarbonate solution. The resultant organic layer was washed with water and saturated saline, dried over anhydrous sodium sulfate and then concentrated under reduced pressure to obtain a crude product. This was purified by silica gel column chromatography (10% ethyl acetate/hexane) to obtain the compound (4).

Yield 1.20 g (98%)

Molecular formula: C$_{24}$H$_{16}$ (304.38)

Melting point: 277.2° C.

Shape: White crystal $^1$H NMR (CDCl$_3$) δ=7.72 (4H, s), 7.69 (4H, m), 7.37 (4H, m), 7.04 (2H, q, J=3.42, 0.98), 5.32 (2H, m) [270 MHz]

$^{13}$C NMR (CDCl$_3$) δ=142.13, 138.24, 131.68, 127.42, 125.52, 121.23, 50.15 [67.8 MHz]

Infrared absorption spectrum (KBr) cm$^{-1}$: 3054, 2973

Mass spectrum (DIEI) m/z: 304 (M+: 100), 278(13)

Elemental analysis: Calcd(%) C=94.70; H=5.30; Found (%) C=94.36; H=5.58.

Synthesis of Compound (5)

NMO (N-methylmorpholine-N-oxide).H$_2$O (5.60 mmol, 0.78 g) and a rotor were placed in a 1 L round bottomed flask, which was purged with argon.

To the flask, 500 ml of acetone was added, and OSO$_4$ (0.10 mmol, 5 ml) was added. To the mixture, the compound (4) (4.11 mmol, 1.25 g) was added; a stopper was inserted; and the resultant mixture was vigorously stirred for 32 hours while maintained at room temperature. The resultant mixture was added with an aqueous solution of Na$_2$S$_2$O$_4$ (0.6 g), stirred for 10 minutes, filtered with Celite, and the mother liquor was extracted with ethyl acetate. The resultant organic layer was washed with water and saturated saline, dried over anhydrous sodium sulfate and then concentrated under reduced pressure to obtain the compound (5) as a white crystal.

Yield 1.36 g (98%)

Molecular formula: C$_{24}$H$_{16}$O$_2$ (338.40)

Melting point: 299.8° C.

Shape: White crystal $^1$H NMR (CDCl$_3$) δ=7.85 (2H, s), 7.80 (8H, m), 7.43 (4H, m), 4.66 (2H, s), 4.22 (2H, s) [270 MHz]

$^{13}$C NMR (CDCl$_3$) δ=137.349, 135.876, 132.722, 127.574, 125.876, 125.813, 125.220, 123.324, 68.411, 51.187 [100.4 MHz]

Infrared absorption spectrum (KBr) cm$^{-1}$: 3432.67, 370.68 (OH)

Mass spectrum (FAB) m/z: 339 (M+: 4)

Elemental analysis: Calcd(%) C=62.15; H=4.69; Found (%) C=62.01; H=4.75.

Synthesis of Compound (6)

Dry DMSO (dimethyl sulfoxide) (132 mmol, 9.4 ml) and 69 ml of dry CH$_2$Cl$_2$ were charged into a three-necked reaction vessel under an inert gas atmosphere, and cooled to −60° C. with an acetone/liquid nitrogen bath. To the mixture, 119 mmol (16.5 ml) of anhydrous trifluoroacetic acid was slowly dropped and stirred for 10 minutes, while maintaining the temperature of the liquid at −60° C. Then, to the resultant mixture, the compound (5) (3.81 mmol, 1.29 g) dissolved in a minimum amount of dry DMSO was slowly dropped and stirred for 15 hours. To the mixture, triethylamine (275 mmol, 20.7 ml) was dropped and stirred for 15 hours, while maintaining the temperature of the liquid at −60° C. The reaction solution was slowly poured into 2MHCl (200 ml) and was extracted with CH$_2$Cl$_2$. The resultant organic layer was washed with deionized water and saturated saline, dried over anhydrous sodium sulfate and then concentrated under reduced pressure to obtain a crude product, which was then added with ethyl acetate. Resultant insolubles were collected by filtration to obtain the compound (6).

Yield 0.55 g (43%)

Molecular formula: C$_{24}$H$_{14}$O$_2$ (334.37)

Melting point: 318-323

Shape: Yellow crystal $^1$H NMR (CDCl$_3$) δ=7.94 (4H, s), 7.84 (4H, m), 7.52 (4H, m), 5.31 (2H, s) [270 MHz]

$^{13}$C NMR (CDCl$_3$) δ=185.165, 133.585, 131.851, 127.862, 127.017, 125.364, 60.603 [67.8 MHz]

Infrared absorption spectrum (KBr) cm$^{-1}$: 1754.90, 1735.62 (C=O)

Mass spectrum (DIEI) m/z: 335 (M+: 4)

Elemental analysis: Calcd(%) C=86.21; H=4.22; Found (%) C=86.41; H=4.40.

Synthesis Example 2

Synthesis of Pentacene (7)

In a Pyrex (registered trade name) glass cell, 0.005 g of the compound (6) was dissolved in 2 ml of chloroform. The solution was sufficiently degassed and then irradiated with the metal halide lamp at room temperature. Blue crystals were precipitated after several minutes. They were collected by filtration to obtain the objective. Yield 0.004 g (96%).

Example 1

FIG. 1 shows the structure of the field effect transistor in the present example. First, an N-type silicon substrate was used as a gate electrode 1. A silicon oxide film with a thickness of 500 nm obtained by thermally oxidizing the surface layer of the silicon substrate was used as a gate insulating film 2. Chromium and gold were deposited in mentioned order on the gate insulating film 2, and a source electrode 3 and a drain electrode 4 were formed by a conventional photolithography technique. Then, the resultant substrate was surface-treated by an ozone treatment and then deposited with pentacene (7) prepared in the synthesis example (2) thereon. The film thickness of the thus prepared organic semiconductor layer 5 was 60 nm.

The field effect transistor with a channel length of 30 μm, a channel width of 10 mm and a thickness of the semiconductor layer of 60 nm was prepared according to the above procedure. The Vd-Id curve of the prepared transistor was measured by Parameter Analyzer 4156 C (trade name) manufactured by Agilent Company. The obtained results showed that the transistor had a field-effect mobility of 8.0×10$^{-1}$ cm$^2$/V·s and an On/Off ratio of 20,000.

Example 2

A 1% by weight solution of the compound (6) in chloroform was spin-cast on the substrate used in Example 1. After drying the substrate with a warm wind of 50° C., the substrate was irradiated with light for 5 minutes using a xenon lamp in which wavelengths of 300 nm or less were cut by a UV-cut filter. An organic semiconductor layer 5 of pentacene (7) was formed on the substrate. The film thickness was 50 nm. The field-effect mobility was measured in the same manner as in Example 1, and it was found to be $5.0 \times 10^{-1}$ cm$^2$/V·s and the On/Off ratio was found to be 50,000.

Example 3

A film of the compound (6) was formed in the same manner as in Example 2. It was irradiated with light for 10 minutes using a metal halide lamp. The film thickness was 60 nm. A field effect transistor was prepared according to Example 1 except the above conditions. The field-effect mobility was measured in the same manner as in Example 1, and it was found to be $3.0 \times 10^{-1}$ cm$^2$/V·s and the On/Off ratio was found to be 40,000.

Example 4

Figure 2A:
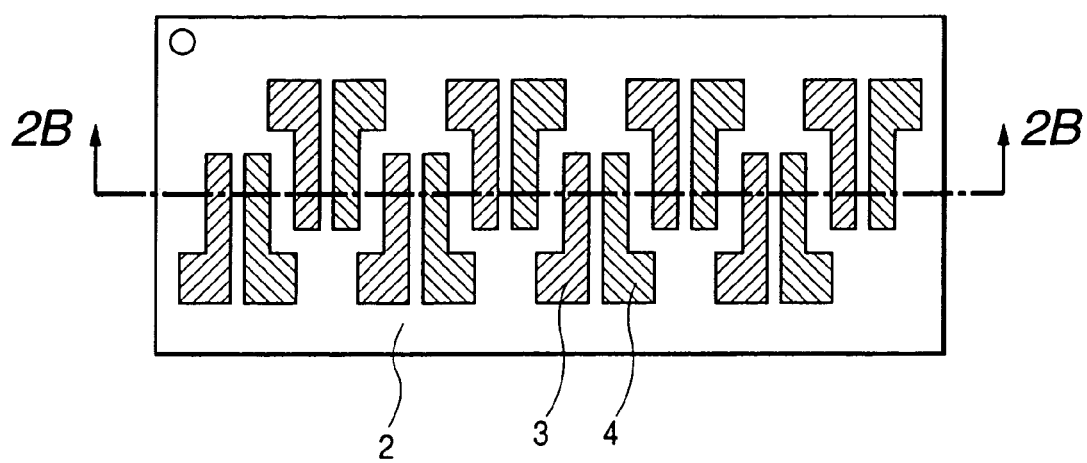
Figure 2B:
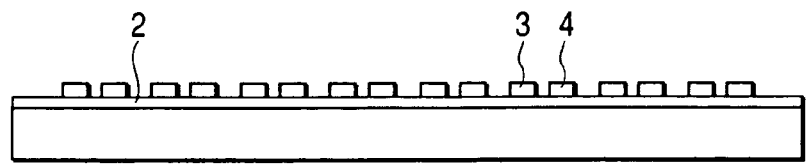
Figure 3:
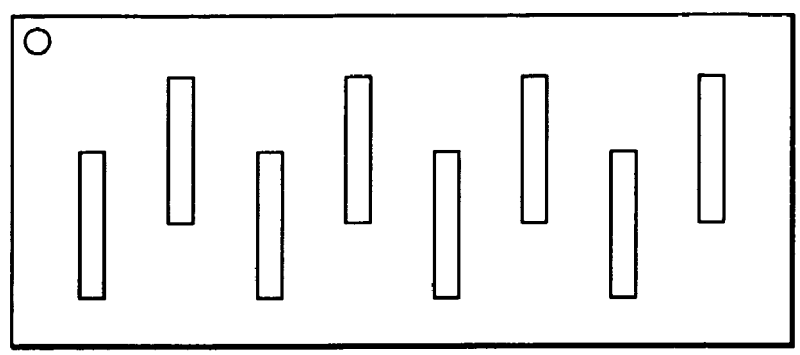
FIG. 3 is a schematic view showing the mask in Example 4 of the present invention.
Figure 4:
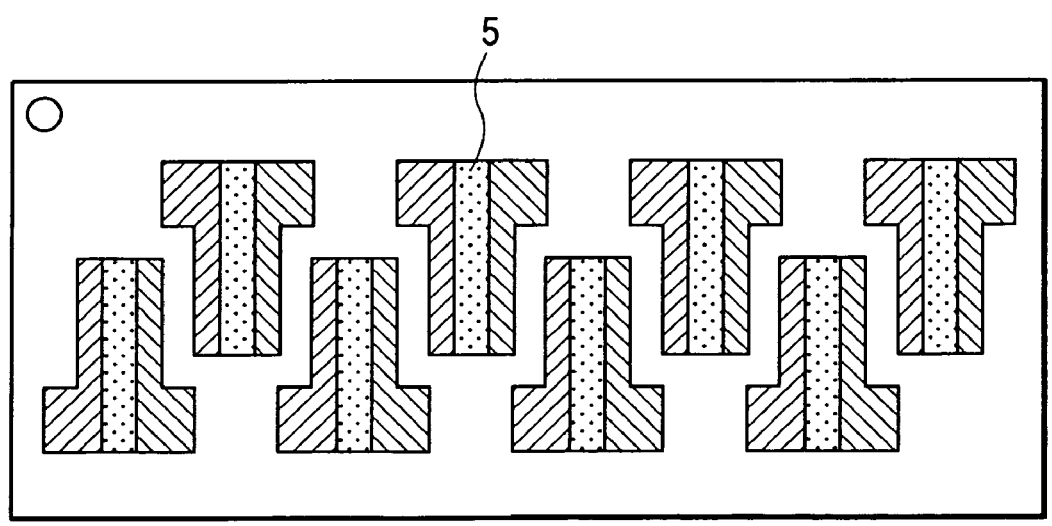
FIG. 4 is a schematic view showing an organic field effect transistor in Example 4 of the present invention.

A substrate with a pattern as shown in FIG. 2 was prepared in the same manner as in Example 1. A 1% by weight solution of the compound (6) in chloroform was spin-cast on this substrate. After drying the substrate with a warm wind of 50° C., the substrate was irradiated with light in the same manner as in Example 2 through a mask shown in FIG. 3. The opening of the mask turned blue, which indicated the formation of the organic semiconductor layer 5 of pentacene (7). The film thickness was 50 nm. After the light irradiation, the substrate was immersed in chloroform to rinse the compound (6). The produced film of pentacene remained unchanged. The field-effect mobility was measured in the same manner as in Example 1, and it was found to be $4.5 \times 10^{-1}$ cm$^2$/V·s and the On/Off ratio was found to be 48,000.

Example 5

A coating film of the compound (6) was prepared on the same substrate as in Example 4 in the same manner as in Example 4. The region between the source electrode and the drain electrode was directly exposed to a dye laser of 460 nm. A blue crystal of pentacene (7) was formed in the exposed part, which indicated the formation of an organic semiconductor layer between the electrodes. The film thickness was 50 nm. The non-irradiated part was rinsed with chloroform. The field-effect mobility was measured in the same manner as in Example 1, and it was found to be $4.8 \times 10^{-1}$ cm$^2$/V·s and the On/Off ratio was found to be 45,000.

Comparative Example 1

A film of the compound (4) was spin-cast on the substrate in Example 1, and the substrate was heated to 250° C. to form a film of pentacene (7). A field effect transistor was prepared according to Example 1 except the above conditions. This transistor had a field-effect mobility of $1.0 \times 10^{-2}$ cm$^2$/V·s and an On/Off ratio of 1,000.

Comparative Example 2

A field effect transistor was prepared in the same manner as Example 1 except that pentacene produced by reducing pentacenedione was used. The transistor had a field-effect mobility of $9.0 \times 10^{-3}$ cm$^2$/V·s and an On/Off ratio of 3,000.

What is claimed is:

1. An organic field effect transistor comprising an organic semiconductor layer, wherein said organic semiconductor layer is composed of an organic semiconductor material produced by photodecomposition of an organic semiconductor precursor, wherein said organic semiconductor precursor is a bicyclic compound containing in a molecule thereof at least one bicyclic ring represented by formula (1):

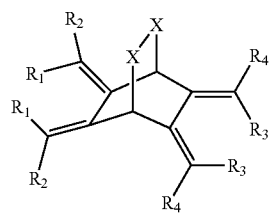

wherein $R_1$ and $R_3$ each denotes a group for forming an aromatic ring or a heteroaromatic ring which may have a substituent, together with a group to be bonded to $R_1$ or $R_3$; $R_2$ and $R_4$ each denotes a hydrogen atom, an alkyl group, an alkoxy group, an ester group or a phenyl group; and X is a leaving group which denotes a carbonyl group.

2. The organic field effect transistor according to claim 1, wherein said organic semiconductor layer is formed in a pattern.

3. An organic field effect transistor comprising an organic semiconductor layer, wherein said organic semiconductor layer is composed of an organic semiconductor material produced by photodecomposition of an organic semiconductor precursor, wherein said organic semiconductor precursor is composed of a bicyclic compound represented by formula (1a):

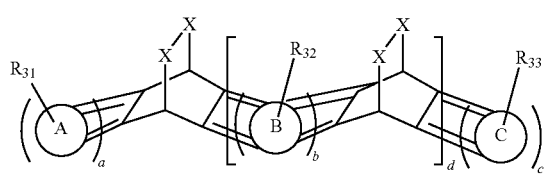

wherein

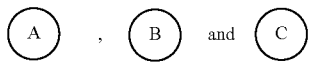

denote an aromatic ring or a heteroaromatic ring which may have a substituent; a, b and c each denote an integer of 1 to 4; d denotes an integer of 0 to 4; $R_{31}$, $R_{32}$ and $R_{33}$ each denotes at least one hydrogen atom, alkyl group, alkoxy group, ester group, aryl group, aralkyl group, phenoxy group, cyano group, nitro group or halogen atom, which may be the same or different; and X is a leaving group, which denotes a carbonyl group.

4. The organic field effect transistor according to claim 3, wherein said organic semiconductor layer is formed in a pattern.

5. An organic field effect transistor comprising an organic semiconductor layer, wherein said organic semiconductor layer is composed of an organic semiconductor material produced by photodecomposition of an organic semiconductor precursor, wherein said organic semiconductor precursor is 6,13-ethanopentacene-6, 13-dione represented by formula (2):

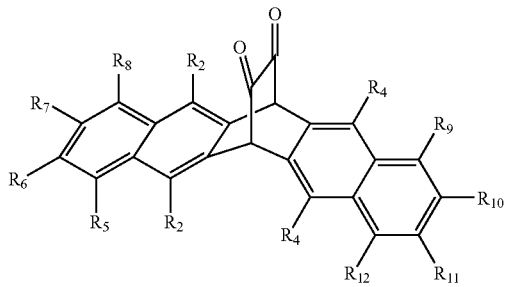

(2)

wherein $R_2$ and $R_4$ each denotes a hydrogen atom, an alkyl group, an alkoxy group, an ester group or a phenyl group; and $R_5$ to $R_{12}$ each denotes a hydrogen atom, an alkyl group, an alkoxy group, an aryl group, an aralkyl group, a phenoxy group, a cyano group, a nitro group, an ester group or a halogen atom, which may be the same or different.

6. The organic field effect transistor according to claim 5, wherein said organic semiconductor layer is formed in a pattern.

7. A method for producing an organic field effect transistor comprising an organic semiconductor layer, which comprises a step of forming said organic semiconductor layer by photodecomposition of an organic semiconductor precursor, wherein said organic semiconductor precursor is a bicyclic compound containing in a molecule thereof at least one bicyclic ring represented by formula (1):

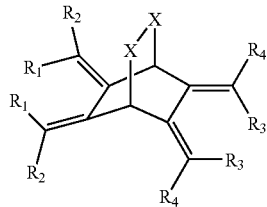

(1)

wherein $R_1$ and $R_3$ each denotes a group for forming an aromatic ring or a heteroaromatic ring which may have a substituent, together with a group to be bonded to $R_1$ or $R_3$, $R_2$ and $R_4$ each denotes a hydrogen atom, an alkyl group, an alkoxy group, an ester group or a phenyl group; and X is a leaving group which denotes a carbonyl group.

8. The method for producing an organic field effect transistor according to claim 7, wherein said photodecomposition is performed by irradiating a film composed of said organic semiconductor precursor with light through an exposure mask.

9. The method for producing an organic field effect transistor according to claim 7, wherein said photodecomposition is performed by direct drawing with light on a film composed of said organic semiconductor precursor.

10. The method for producing an organic field effect transistor according to claim 7, wherein in a film composed of said organic semiconductor precursor, portions of said film which have not been exposed to light are rinsed with a solvent.

11. A method for producing an organic field effect transistor comprising an organic semiconductor layer, which comprises a step of forming said organic semiconductor layer by photodecomposition of an organic semiconductor precursor, wherein said organic semiconductor precursor is composed of a bicyclic compound represented by formula (1a):

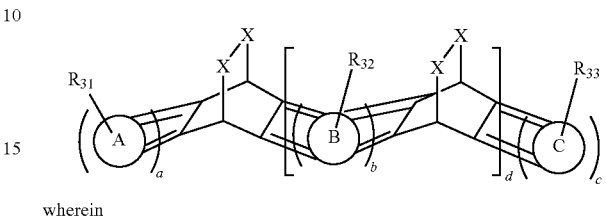

(1a)

wherein

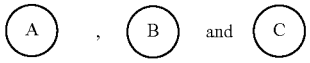

denote an aromatic ring or a heteroaromatic ring which may have a substituent; a, b and c each denote an integer of 1 to 4; d denotes an integer of 0 to 4; $R_{31}$, $R_{32}$ and $R_{33}$ each denotes at least one hydrogen atom, alkyl group, alkoxy group, ester group, aryl group, aralkyl group, phenoxy group, cyano group, nitro group or halogen atom, which may be the same or different; and X is a leaving group, which denotes a carbonyl group.

12. The method for producing an organic field effect transistor according to claim 11, wherein said photodecomposition is performed by irradiating a film composed of said organic semiconductor precursor with light through an exposure mask.

13. The method for producing an organic field effect transistor according to claim 11, wherein said photodecomposition is performed by direct drawing with light on a film composed of said organic semiconductor precursor.

14. The method for producing an organic field effect transistor according to claim 11, wherein in a film composed of said organic semiconductor precursor, portions of said film which have not been exposed to light are rinsed with a solvent.

15. A method for producing an organic field effect transistor comprising an organic semiconductor layer, which comprises a step of forming said organic semiconductor layer by photodecomposition of an organic semiconductor precursor, wherein said precursor of the organic semiconductor is 6,13-ethanopentacene-6, 13-dione represented by formula (2):

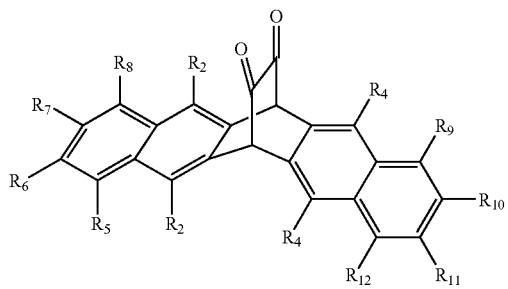

(2)

wherein $R_2$ and $R_4$ each denotes a hydrogen atom, an alkyl group, an alkoxy group, an ester group or a phenyl group; and $R_5$ to $R_{12}$ each denotes a hydrogen atom, an alkyl group, an alkoxy group, an aryl group, an aralkyl group, a phenoxy group, a cyano group, a nitro group, an ester group or a halogen atom, which may be the same or different.

16. The method for producing an organic field effect transistor according to claim 15, wherein said photodecomposition is performed by irradiating a film composed of said organic semiconductor precursor with light through an exposure mask.

17. The method for producing an organic field effect transistor according to claim 15, wherein said photodecomposition is performed by direct drawing with light on a film composed of said organic semiconductor precursor.

18. The method for producing an organic field effect transistor according to claim 15, wherein in a film composed of said organic semiconductor precursor, portions of said film which have not been exposed to light are rinsed with a solvent.

* * * * *